(12) United States Patent
Zhang et al.

(10) Patent No.: US 11,158,625 B2
(45) Date of Patent: Oct. 26, 2021

(54) ELECTROSTATIC PROTECTION DEVICE AND MANUFACTURING METHOD THEREOF AND ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Donghui Zhang, Beijing (CN); Huan Ni, Beijing (CN); Xiaoye Ma, Beijing (CN); Rui Ma, Beijing (CN); Xiping Wang, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 584 days.

(21) Appl. No.: 16/092,720

(22) PCT Filed: Apr. 3, 2018

(86) PCT No.: PCT/CN2018/081731
§ 371 (c)(1),
(2) Date: Oct. 10, 2018

(87) PCT Pub. No.: WO2018/205774
PCT Pub. Date: Nov. 15, 2018

(65) Prior Publication Data
US 2021/0183848 A1    Jun. 17, 2021

(30) Foreign Application Priority Data
May 11, 2017  (CN) .......................... 201710330412.5

(51) Int. Cl.
*H01L 27/02*    (2006.01)
*H01L 41/09*    (2006.01)
(Continued)

(52) U.S. Cl.
CPC ....... *H01L 27/0248* (2013.01); *H01H 71/127* (2013.01); *H01L 23/60* (2013.01);
(Continued)

(58) Field of Classification Search
CPC ... H01L 27/0248; H01L 23/60; H01L 41/094; H01L 41/257; H01H 71/127; G02F 1/136204
(Continued)

(56) References Cited

U.S. PATENT DOCUMENTS

2009/0120772 A1 * 5/2009 Namose ................ G02F 1/1365
                                                              200/181
2012/0300355 A1   11/2012 Umeda et al.
(Continued)

FOREIGN PATENT DOCUMENTS

| CN | 102802333 A | 11/2012 |
| CN | 205944083 U | 2/2017 |
| CN | 107146792 | 9/2017 |

OTHER PUBLICATIONS

Jul. 9, 2018—(WO) International Search Report and Written Opinion Appn PCT/CN2018/081731 with English Translation.

*Primary Examiner* — David Vu
*Assistant Examiner* — Brandon C Fox
(74) *Attorney, Agent, or Firm* — Banner & Witcott, Ltd.

(57) ABSTRACT

An electrostatic protection device includes: a first conductive layer, a second conductive layer and a polarization film layer, in which the polarization film layer is disposed between the first conductive layer and the second conductive layer and formed of a piezoelectric material which is capable of deforming when applied with electricity; a conductive cantilever, disposed on the second conductive layer and including a free end; and a charge diffusion layer, disposed at a side of the conductive cantilever away from the polar- (Continued)

ization film layer, electrically connected with the first conductive layer and spaced apart from the conductive cantilever, in which upon a voltage difference between the first conductive layer and the second conductive layer reaching a predetermined value, the polarization film layer deforms to allow the conductive cantilever to connect with the charge diffusion layer.

20 Claims, 9 Drawing Sheets

(51) Int. Cl.
    *H01H 71/12*     (2006.01)
    *H01L 23/60*     (2006.01)
    *H01L 41/257*    (2013.01)
    *G02F 1/1362*    (2006.01)
(52) U.S. Cl.
    CPC .......... *H01L 41/094* (2013.01); *H01L 41/257* (2013.01); *G02F 1/136204* (2013.01)
(58) Field of Classification Search
    USPC ........................................................ 257/335
    See application file for complete search history.

(56) References Cited

U.S. PATENT DOCUMENTS

| | | | |
|---|---|---|---|
| 2015/0187799 A1* | 7/2015 | Yang | H01L 27/124 |
| | | | 257/72 |
| 2015/0311003 A1* | 10/2015 | Fitzgerald | H01H 1/0036 |
| | | | 200/181 |

* cited by examiner

ELECTROSTATIC PROTECTION DEVICE AND MANUFACTURING METHOD THEREOF AND ARRAY SUBSTRATE

TECHNICAL FIELD

The application is a U.S. National Phase Entry of International Application No. PCT/CN2018/081731 filed on Apr. 3, 2018, designating the United States of America and claiming priority to Chinese Patent Application No. 201710330412.5, filed on May 11, 2017. The present application claims priority to and the benefit of the above-identified applications and the above-identified applications are incorporated by reference herein in their entirety.

BACKGROUND

A function of an electrostatic protection device is to prevent a semiconductor device of a display panel from breaking down or failure due to the effect of electrostatic discharge. For example, the electro-static discharge (ESD) protection design between a data line and a common electrode line disposed at the data pad (DP) side and the data pad opposite (DPO) side of a display panel is especially important. An existing ESD protection device consists of 2-4 triodes electrically connected in parallel or in series, that is, to form a strengthened diode. In a case where the voltage difference value between the data line and the common electrode line disposed at the DP side and the DPO side reaches a certain degree, the static electricity of the data line and the common electrode line of the display panel is discharged. Similar phenomenon occurs between the gate pad (GP) side and the gate pad opposite (GPO) side.

However, an electric current still exists in the ESD protection device under a normal voltage, as illustrated in the FIG. 1 which illustrates a relationship between an input voltage and an input current; that is, the data line and the common electrode line remain connected under the normal voltage, which certainly interferes with the signal loaded over the data line.

SUMMARY

An embodiment of the present disclosure provides an electrostatic protection device, comprising: a first conductive layer, a second conductive layer and a polarization film layer, wherein the polarization film layer is disposed between the first conductive layer and the second conductive layer and formed of a piezoelectric material which is capable of deforming when applied with electricity; a conductive cantilever, disposed on the second conductive layer and comprising a free end; and a charge diffusion layer, disposed at a side of the conductive cantilever away from the polarization film layer, electrically connected with the first conductive layer and spaced apart from the conductive cantilever. Upon a voltage difference between the first conductive layer and the second conductive layer reaching a predetermined value, the polarization film layer deforms to allow the free end of the conductive cantilever to connect with the charge diffusion layer.

For example, the electrostatic protection further comprises an orientation layer disposed between the first conductive layer and the polarization film layer.

For example, a material of the orientation layer comprises polysilicon.

For example, a deforming direction of the polarization film layer is along a voltage applying direction between the first conductive layer and the second conductive layer.

For example, a projection of the charge diffusion layer on the first conductive layer is at least partially overlapped with a projection of the free end of the conductive cantilever on the first conductive layer.

For example, the electrostatic protection device according to any one of claim 1 to claim 4, wherein the polarization film layer comprises a Cr-doped zinc oxide layer.

Embodiments of the present disclosure further provide a manufacturing method of an electrostatic protection device, comprising: sequentially forming a first conductive layer, a polarization film layer, and a second conductive layer, the polarization film layer comprising a piezoelectric material which is capable of deforming when applied with electricity; forming a conductive cantilever on the second conductive layer, the conductive cantilever comprising a free end; forming a charge diffusion layer which is electrically connected with the first conductive layer, disposed at a side of the conductive cantilever away from the polarization film layer and spaced apart from the conductive cantilever. Upon a voltage difference between the first conductive layer and the second conductive layer reaching a predetermined value, the polarization film layer deforms to allow the free end of the conductive cantilever to connect with the charge diffusion layer.

For example, forming the polarization film layer comprises: forming a piezoelectric film layer on the first conductive layer; and performing a polarization treatment on the piezoelectric film layer in a condition that the voltage difference between the first conductive layer and the second conductive layer reaches the predetermined value.

For example, the method the further comprising: before forming the polarization film layer, forming an orientation layer on the first conductive layer, wherein the orientation layer is configured to decrease a lattice mismatch between the first conductive layer and the polarization film layer.

For example, a material of the orientation layer comprises polysilicon.

For example, forming the piezoelectric film layer comprises: depositing a piezoelectric material to form a weak-orientation film layer; and annealing the weak-orientation film layer at a first predetermined temperature to form a first piezoelectric film layer with a polycrystalline structure, wherein the first predetermined temperature is higher than or equal to 250° C. as well as lower than or equal to 350° C.

For example, performing a polarization treatment on the piezoelectric film layer comprises: allowing the first piezoelectric film layer to a second predetermined temperature, and adjusting the voltage difference between the first conductive layer and the second conductive layer, wherein the second predetermined temperature is higher than or equal to 50° C. as well as lower than or equal to 150° C.; and after the voltage difference between the first conductive layer and the second conductive layer as adjusted reaching the predetermined value, cooling the first piezoelectric film layer to a third predetermined temperature so as to form the polarization film layer, wherein the third predetermined temperature is higher than or equal to 10° C. as well as lower than or equal to 40° C.

For example, forming the conductive cantilever comprises: forming an insulating layer after forming the second conductive layer, wherein a gap is between the insulating layer and the second conductive layer; forming in the gap a first photoresist which is connected with the second conductive layer and has a surface with a same height as a surface of the second conductive layer; and forming a first nano indium tin metal oxide layer on the second conductive layer and the first photoresist and forming the conductive cantilever through a first annealing treatment.

For example, a surface of the insulating layer is higher than a surface of the conductive cantilever, and forming the charge diffusion layer comprises: forming in the gap a second photoresist which is connected with the insulating layer and has a surface with a same height as a surface of the insulating layer; forming a second nano indium tin metal oxide layer on the insulating layer and the second photoresist and forming the charge diffusion layer through a second annealing treatment.

Embodiments of the present disclosure further provide an array substrate, comprising the above-mentioned electrostatic protection device.

For example, the array substrate comprises a display region and a peripheral region, and the electrostatic protection device is disposed in the peripheral region.

For example, the array substrate comprises a gate line and a common electrode line, the first conductive layer of the electrostatic protection device is connected with the gate line, and the second conductive layer of the electrostatic protection device is connected with the common electrode line.

For example, the first conductive layer is disposed in a same layer as the gate line and the second conductive layer is disposed in a same layer as the common electrode line.

For example, the array substrate comprises a data line and a common electrode line, the first conductive layer of the electrostatic protection device is connected with the data line, and the second conductive layer of the electrostatic protection device is connected with the common electrode line.

For example, the first conductive layer is disposed in a same layer as the data line and the second conductive layer is disposed in a same layer as the common electrode line.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 2b is a sectional view along the section line A-A' in FIG. 2a;

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
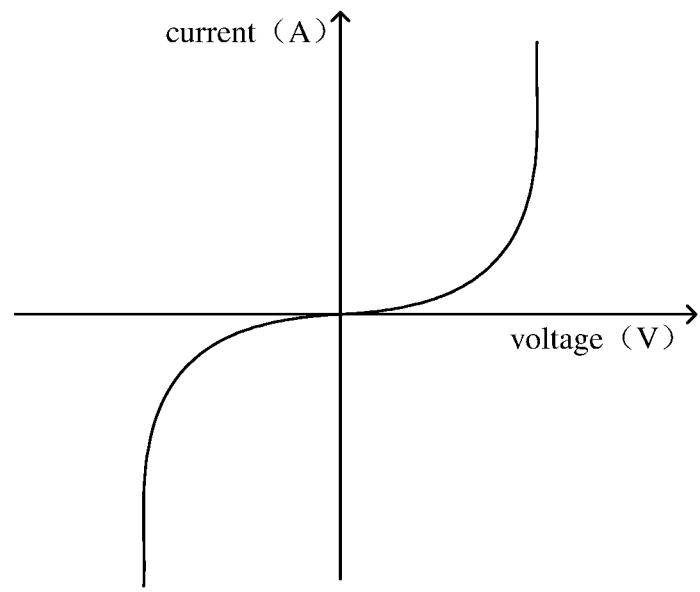
FIG. 1 is a schematic view of a relationship between the voltage and the current of an ESD protection device.
Figure 2A:
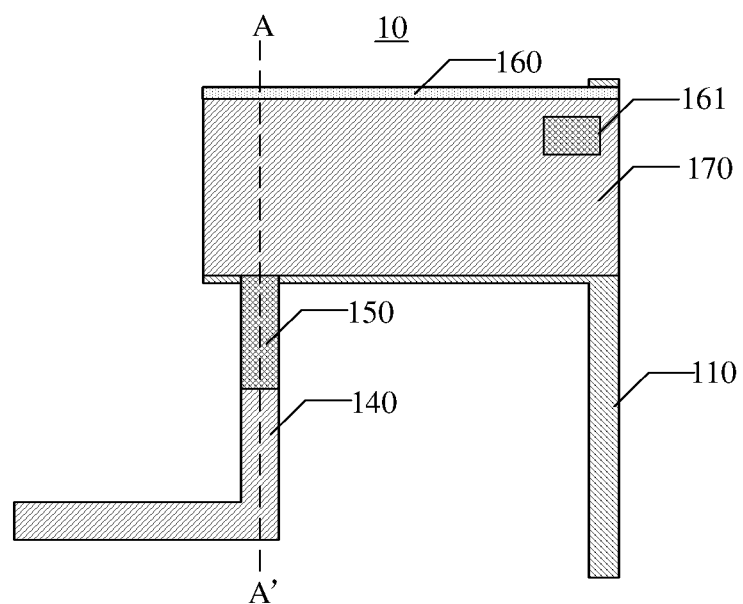
FIG. 2a is a schematic view of an electrostatic protection device provided by an embodiment of the present disclosure.
Figure 2B:
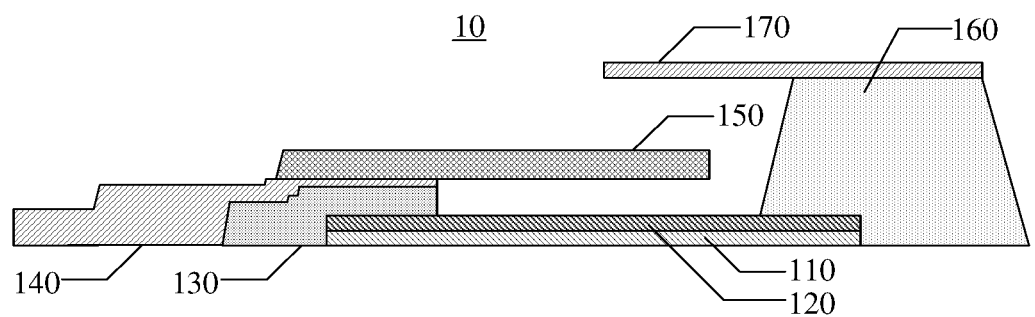

Referring to a plan view in FIG. 2a and a sectional view along A-A' in FIG. 2b, an embodiment of the present disclosure provides an electrostatic protection device 10, and this electrostatic protection device comprises: a first conductive layer 110, a polarization film layer 130 which is at least partially formed on a first insulating layer 120 and formed of a piezoelectric material which is capable of deforming when applied with electricity, a second conductive layer 140 which is at least partially formed on the polarization film layer 130, a conductive cantilever 150 formed on the second conductive layer, a second insulating layer 160 formed on the first insulating layer 120, and a charge diffusion layer 170 which is formed on the second insulating layer 160 and is connected with the first conductive layer 110 through a via hole 161 in the second insulating layer 160. The conductive cantilever 150 is disposed between the charge diffusion layer 170 and the first conductive layer 110.

For example, the first conductive layer 110 and the second conductive layer 140 are each made of a metal material.

For example, the electrostatic protection device 10 can further comprise the first insulating layer 120 disposed between the first conductive layer 110 and the polarization film layer 130.

Figure 2C:
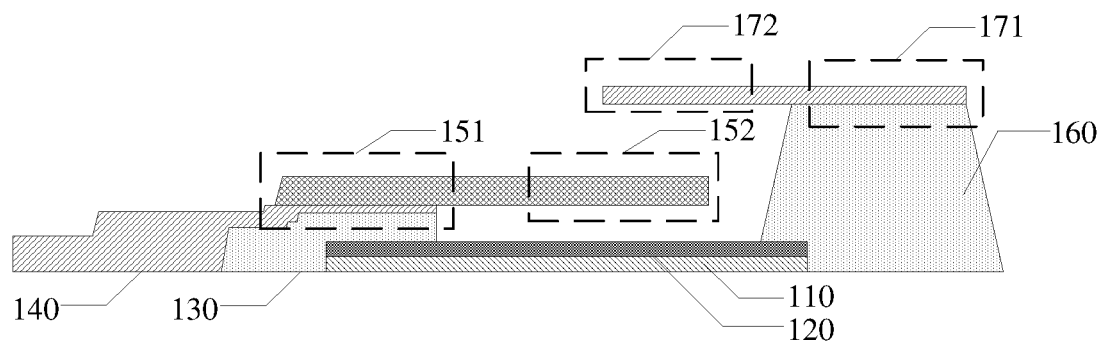
FIG. 2c is a schematic view of an electrostatic protection device provided by an embodiment of the present disclosure.

The conductive cantilever 150 comprises a fixed end 151 and a free end 152, and the fixed end 151 is connected with the second conductive layer 140. The charge diffusion layer 170 comprises a first end 171 and a second end 172, and the first end 171 is connected with the first conductive layer 110 through the via hole 161 in the second insulating layer 160 (the position of the via hole 161 in the second insulating layer 160 can be referred to FIG. 2a). The conductive cantilever 150 is spaced apart from the charge diffusion layer 170. For example, as illustrated in FIG. 2c, a gap exists between the free end 152 of the conductive cantilever 150 and the second end 172 of the charge diffusion layer 170, and a projection of the free end 152 on the first conductive layer 110 is at least partially overlapped with a projection of the second end 172 on the first conductive layer 110.

The operation mode of the electrostatic protection device 10 is described as follows.

Figure 2D:
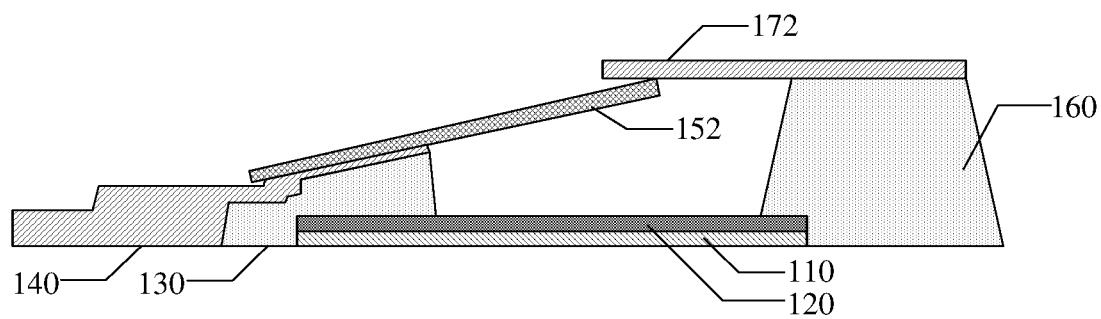
FIG. 2d is schematic view of an electrostatic protection device in a state of discharging provided by an embodiment of the present disclosure.

Upon the voltage difference between the first conductive layer 110 and the second conductive layer 140 reaching a predetermined value, the polarization film layer 130 deforms to allow the free end 152 of the conductive cantilever to connect with the second end 172 of the charge diffusion layer so as to implement a discharge operation of the electrostatic protection device. For example, as illustrated in FIG. 2d, the free end 152 of the conductive cantilever moves upward in the gap due to the deformation of the polarization film layer 130 so as to connect with the second end 172 of the charge diffusion layer.

Upon the voltage difference between the first conductive layer 110 and the second conductive layer 140 being below the predetermined value, the polarization film layer 130 returns to the initial state so that the free end 152 of the conductive cantilever is disconnected with the charge diffusion layer 170.

The electrostatic protection device can have a variety of uses when applied in a display panel. For example, the electrostatic protection device can be configured to connect the data line and the common electrode line to realize an ESD protection between the data line and the common electrode line. For example, the first conductive layer 110 is connected with the data line of the display panel and the second conductive layer 140 is connected with the common electrode line. For example, the electrostatic protection device can be further configured to connect the gate line and the common electrode line to realize an ESD protection between the gate line and the common electrode line. For example, the first conductive layer 110 is connected with the gate line of the display panel and the second conductive layer 140 is connected with the common electrode line. For example, the electrostatic protection device can further connect the gate line or the data line to a shorting bar to evacuate redundant static electricity produced in the wirings to the shorting bar.

The piezoelectric material is a material which is usually used in mechanics and electronics currently. However, to make the technical solution of the embodiments of the present disclosure better understood, the piezoelectric material is briefly introduced as follows. The piezoelectric material after a polarization treatment usually has two properties. One of the properties is the piezoelectric material can deform along an electric field direction or a tangential direction when applied with a voltage along the polarization direction of the piezoelectric material. The other property is the piezoelectric material can produce a voltage along an external action direction or a tangential direction of the external action when deforming under the external action.

The piezoelectric material can realize a reversible conversion between mechanic deformation and electricity.

Figure 3A:
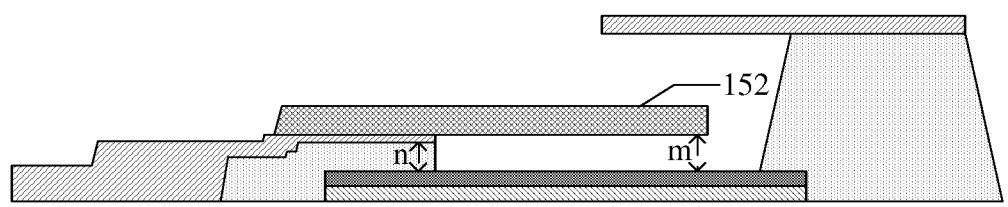
FIG. 3a-FIG. 3c are schematic views of an electrostatic protection device provided by an embodiment of the present disclosure.
Figure 3B:
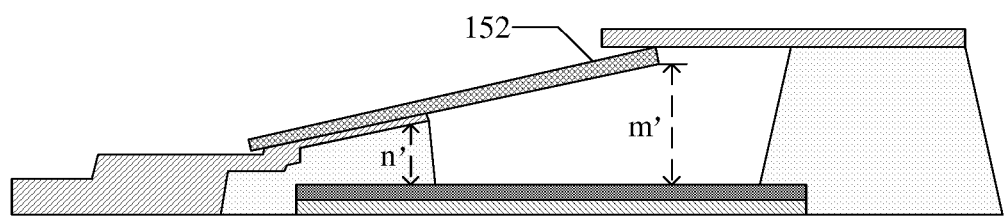

According to a deformation equation of the piezoelectric material, the voltage value applied to the piezoelectric material is positively correlated with the deformation value (the increment) of the piezoelectric material. For example, the deformation equation of the piezoelectric material is $S=d33Ud$, where S is the deformation value of the piezoelectric material, d33 is a piezoelectric constant which usually can reach 140 pC/N, and Ud is the voltage value applied to the piezoelectric material. In the embodiments of the present disclosure, the voltage value applied to the piezoelectric material is the voltage difference between the first conductive layer and the second conductive layer; the deformation value of the piezoelectric material can be a first distance difference value $\Delta m$ between m and m', where m is the vertical distance from the first insulating layer to the conductive cantilever in an initial state and m' is the vertical distance from the first insulating layer to the conductive cantilever after the deformation; and the deformation value of the piezoelectric material can also be a second distance difference value $\Delta n$ between n and n', where n is the vertical distance from the second conductive layer to the first insulating layer in an initial state and n' is the vertical distance from the second conductive layer to the first insulating layer after the deformation, as illustrated in FIG. 3a and FIG. 3b.

Figure 3C:
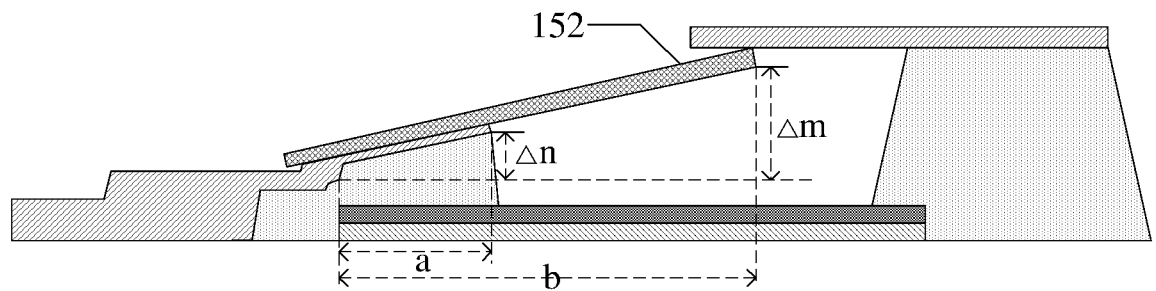

In addition, referring the FIG. 3c, it can be obtained according to the triangle parallel line theorem that:

$$\Delta m/\Delta n=a/b,$$

where $\Delta m$ is the first distance difference value which is a distance between the free end of the conductive cantilever and the free end of the charge diffusion layer, $\Delta n$ is the second distance difference value which is the deformation value of the polarization film layer, "a" is the length of an projection of the polarization film layer on the first conductive layer along an extension direction of the conductive cantilever, and "b" is the length of an projection of the conductive cantilever on the first conductive layer along an extension direction of the conductive cantilever.

In view of the above, in a case where a certain voltage value is applied to the piezoelectric material, $\Delta n$ is a fixed value and the ratio a to b is linearly positively correlated with $\Delta m$.

For more specific understanding of the deformation value of the polarization film layer, detailed experimental data are enumerated for illustration. In a case where the voltage difference value between the first conductive layer and the second conductive layer is 100 V, that is, the polarization film layer receives a vertically upward applied external voltage 100 V, the polarization film layer can produce an elongation of 14 nm in the vertical direction to reduce the distance between the first conductive layer and the second conductive layer so as to weaken the external electrical field, according to the inverse piezoelectric effect.

For example, in order to prevent breakdown, the preferred value of b/a is 40. In the case where the voltage value difference value between the first conductive layer and the second conductive layer reaches 50V, the polarization film layer deforms so as to connect the conductive cantilever and the charge diffusion layer, so that the common electrode line is connected with the data line and the redundant electric charges produced due to static electricity are guided to the common electrode line through the conductive cantilever freely.

In view of the above, the formation direction of the polarization film layer is the direction of the voltage between the first conductive layer and the second conductive layer.

Figure 2E:
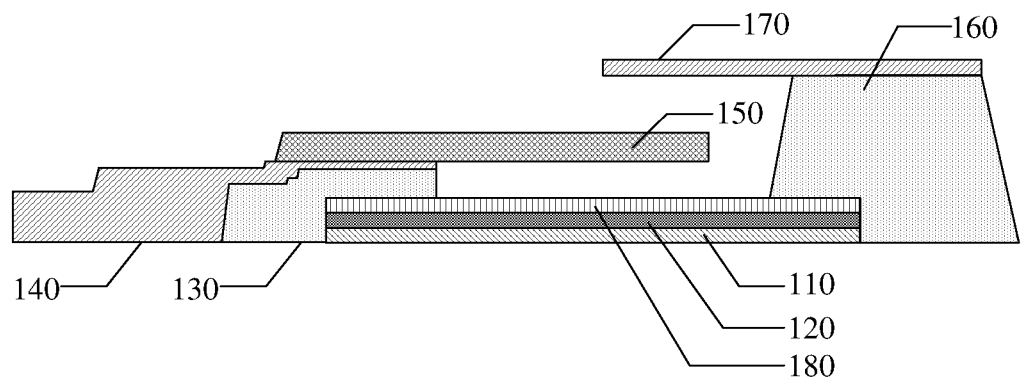
FIG. 2e is schematic view of an electrostatic protection device provided by an embodiment of the present disclosure.

For example, referring to FIG. 2e, the electrostatic protection device provided by at least one embodiment of the present disclosure further comprises an orientation layer 180 formed on the first insulating layer. The orientation layer 180 is configured to buffer a lattice mismatch between the first conductive layer 110 and the polarization film layer 130 so as to facilitate an orderly arrangement of the atoms in the polarization film layer 130. The atom distance in the orientation layer is usually greater than the metal atom distance and is closer to the atom distance in the polarization film layer so as to benefit the order atom arrangement in the polarization film layer. For example, the material of the orientation layer 180 is polysilicon. For example, the atom distance difference value between polysilicon and the polarization film layer is less than or equal to 10 pm.

For example, the polarization film layer can adopt a thin film formed of zinc oxide, for example, a thin film formed of Cr-doped zinc oxide. Because atoms in the zinc oxide thin film that is not treated by way of a polarization treatment are spontaneously and disorderly arranged, atoms in the zinc oxide thin film can be arranged according to an electric field direction by an applied voltage after the thin film is applied with the voltage. That is, the polarization direction of the polarization film layer is the electric field direction. An oxide thin film can be easily prepared and has characteristics such as good and stable electrical property, no poison, no pollution, and the like.

For example, the thickness of the polarization film layer is 400 nm.

For example, the conductive cantilever and the charge diffusion layer can be both formed of nano indium tin metal oxide.

The electrostatic protection device provided by the embodiments of the present disclosure can be applied in a micro electro mechanical system (MEMS).

Figure 4:
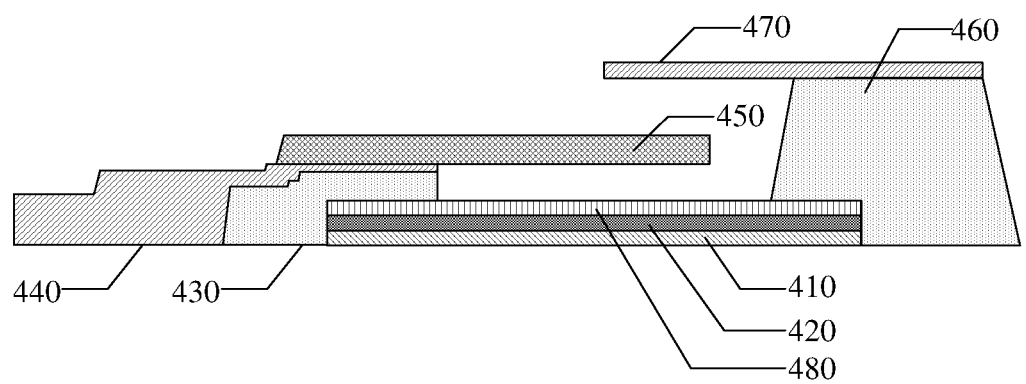
FIG. 4 is a schematic view of an electrostatic protection device provided by another embodiment of the present disclosure.

Referring to FIG. 4, another embodiment of the present disclosure provides an electrostatic protection device, comprising: a gate metal layer 410, a gate insulating layer 420, a polarization film layer 430, a common electrode layer 440, a conductive cantilever 450, a second insulating layer 460, a charge diffusion layer 470 and an active layer 480.

A specific operation manner of the electrostatic protection device is described in the following.

Upon the voltage difference between the gate metal layer 410 and the common electrode layer 440 reaching a predetermined value, the polarization film layer 430 deforms to allow the free end of the conductive cantilever to connect with the free end of the charge diffusion layer so as to realize a discharge operation of the electrostatic protection device.

Upon the voltage difference between the gate metal layer 410 and the common electrode layer 440 being under the predetermined value, the polarization film layer 430 returns to an initial state so that the free end of the conductive cantilever and the free end of the charge diffusion layer are disconnected.

Embodiments of the present disclosure further provide an array substrate and the array substrate comprises the above-mentioned electrostatic protection device 10.

Figure 7:
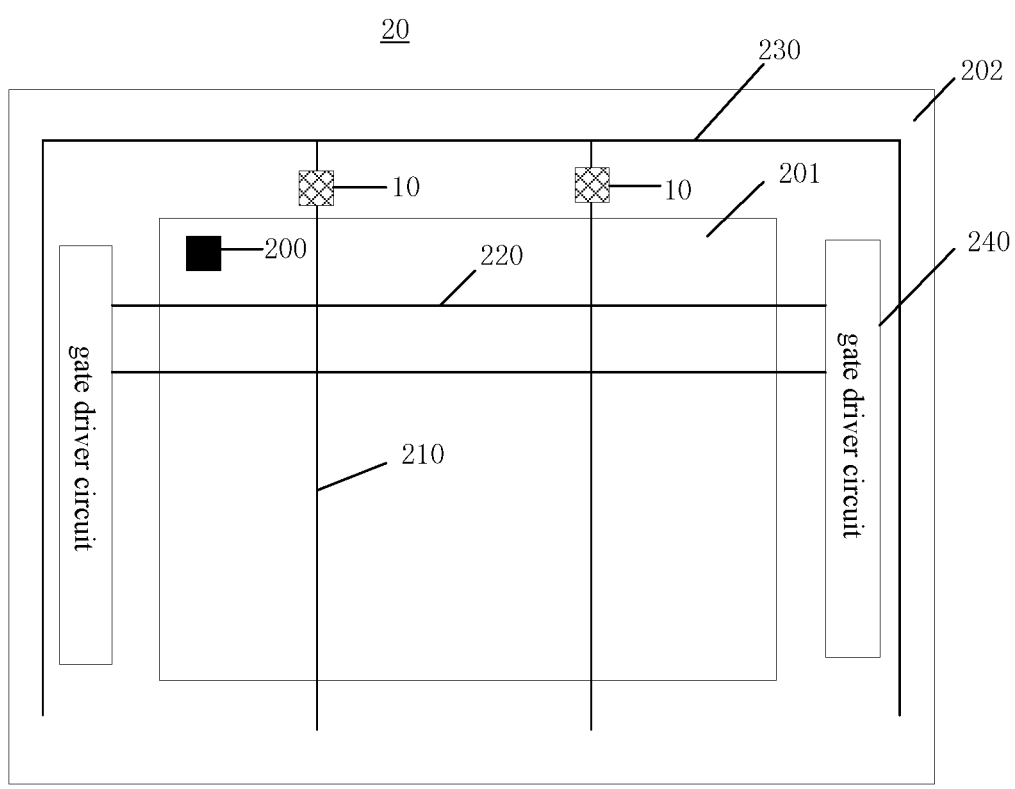
FIG. 7 is a plan view of an array substrate provided by an embodiment of the present disclosure.

FIG. 7 illustrates a plane view of the array substrate 20 provided by an embodiment of the present disclosure. As is illustrated in the figure, the array substrate 20 comprises a display region 201 and a peripheral region 202 and the electrostatic protection device 10 is disposed in the peripheral region 202. The array substrate 20 comprises a plurality of gate lines 210 and a plurality of data lines 220, the gate lines 210 intersect with the data lines 220 to define a plurality of pixel regions in the display region 201, and each pixel region is provided with a pixel unit 200. The array substrate 20 further comprises a common electrode line 230, and for clarification, only a part of the common electrode line 230 is shown in the figure. A thin film transistor array (not shown) is disposed in the display region 201. For example, the array substrate 20 is applied in a liquid crystal display and the thin film transistor is configured to be the switch element of the pixel unit 200.

In this embodiment, the electrostatic protection devices 10 are disposed in the peripheral region 202 above the display region 201 and below the display region 201, that is, the DP side and the DPO side of the array substrate 20, to connect the data lines 220 and the common electrode line 230 so as to realize the electrostatic protection between the data lines 220 and the common electrode line 230. For example, the first conductive layer 110 is connected with the data line 220 and the second conductive layer 140 is connected with the common electrode line 230. For example, the first conductive layer 10 and the data line 220 are disposed in a same layer and formed in a same patterning process, and the second conductive layer 140 and the common electrode line 230 are disposed in a same layer and formed in a same patterning process. For example, the common electrode line 230 and the source-drain electrode layer of the thin film transistor array are disposed in a same layer and formed in a same patterning process.

It should be noted that the phrase "disposed in a same layer" indicates that two (or more than two) material layer structures are formed through a same deposition process and are patterned through a same patterning process, so the materials of the two (or more than two) material layer structures are same.

In another embodiment, the electrostatic protection device 10 can be disposed in the peripheral region 202 in the left side of the display region 201 and the right side of the display region 201, that is, the GP side and the GPO side of the array substrate 20, to connect the gate line 210 and the common electrode line 230 so as to realize the electrostatic protection between the gate line 210 and the common electrode line 230. For example, the first conductive layer 10 is connected with the gate line 210 and the second conductive layer 140 is connected with the common electrode line 230. For example, the first conductive layer 10 and the gate line 210 are disposed in a same layer and formed in a same patterning process, and the second conductive layer 140 and the common electrode line 230 are disposed in a same layer and formed in a same patterning process.

In another embodiment, the electrostatic protection device 10 can be further configured to connect the gate line 210 or the data line 220 to a shorting bar, so the redundant static electricity in the circuit can be evacuated to the shorting bar to realize the electrostatic protection. In this case, the first conductive layer 110 or the second conductive layer 140 is connected with the shorting bar.

For example, in a case where the electrostatic protection device comprises an orientation layer 180, the orientation layer 180 can be formed in a same layer as the active layer of the thin film transistor array and can be formed in a same patterning process as the active layer of the thin film transistor array.

For example, the array substrate 20 can further comprise a gate-driver-on-array (GOA) gate driver circuit 240 which is disposed in the peripheral region 202 in the left side and the right side of the display region 201. The gate driver circuit 240 is configured to be connected with a plurality of gate lines to provide gate scan signals.

For example, the common electrode line 230 can be formed in a same layer as the source-drain electrode layer of the thin film transistor array and can be formed in a same process as the source-drain electrode layer of the thin film transistor array.

The electrostatic protection device 10 can be configured to evacuate the redundant static electricity of the circuit to the common electrode line or the shorting bar upon the voltage of the circuit (e.g. the gate line or the data line) reaching the predetermined voltage so as to realize the electrostatic protection. The working principle of the electrostatic protection device 10 has been described in the above, which is not repeated here.

Embodiments of the present disclosure further provide a manufacturing method of the above-mentioned electrostatic protection device, comprising: sequentially forming a first conductive layer, a polarization film layer, and a second conductive layer, the polarization film layer comprising a piezoelectric material which is capable of deforming when applied with electricity; forming a conductive cantilever on the second conductive layer, the conductive cantilever comprising a free end; forming a charge diffusion layer which is electrically connected with the first conductive layer, disposed at a side of the conductive cantilever away from the polarization film layer and spaced apart from the conductive cantilever, wherein upon a voltage difference between the first conductive layer and the second conductive layer reaching a predetermined value, the polarization film layer deforms to allow the free end of the conductive cantilever to connect with the charge diffusion layer.

For example, materials of the first conductive layer and the second conductive layer are metal materials.

For example, an orientation layer can be further formed between the first conductive layer and the polarization film layer so as to facilitate the order arrangement of the atoms in the polarization film layer.

For example, a first insulating layer can be further formed between the first conductive layer and the polarization film layer.

Figure 5:
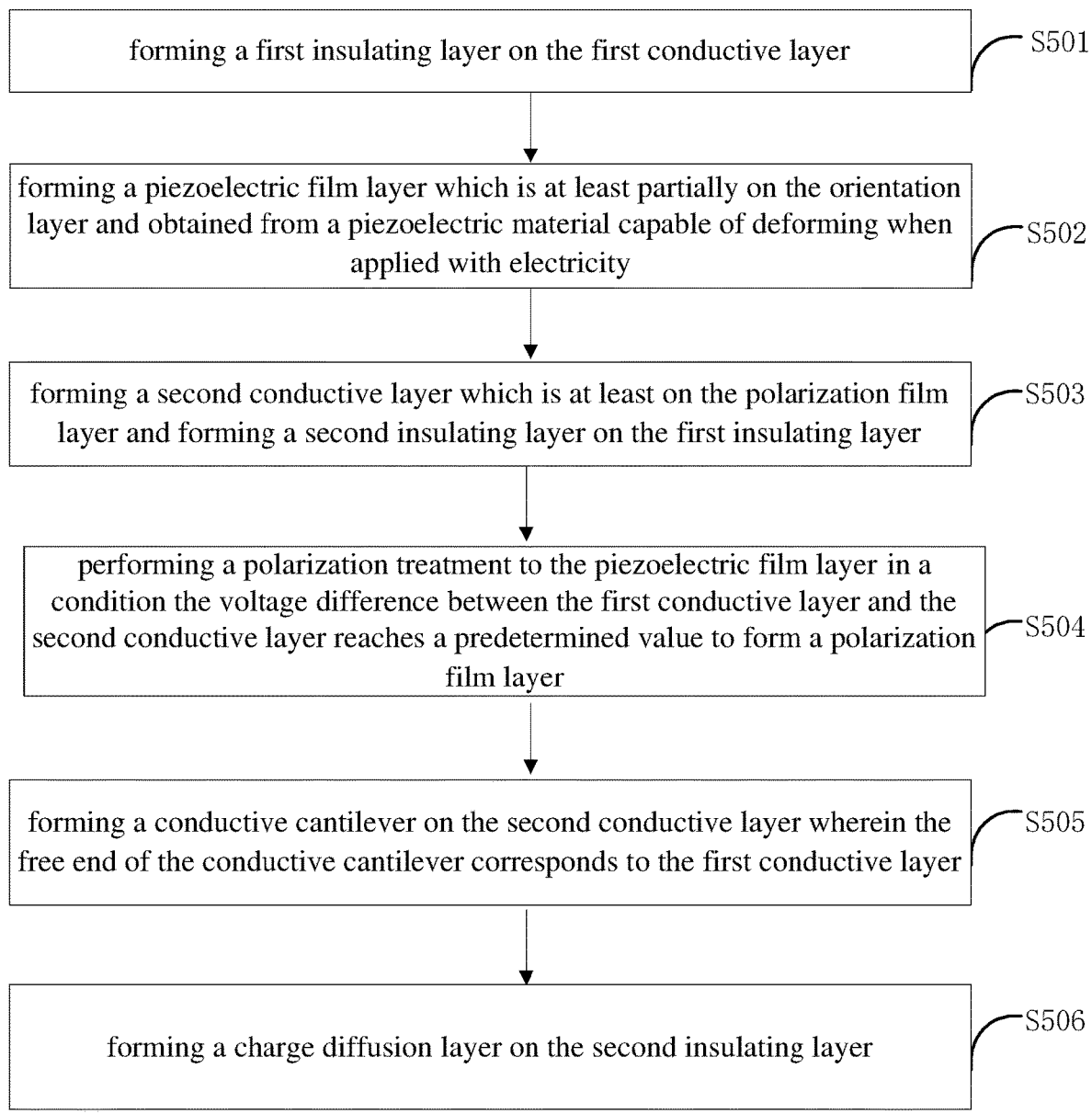
FIG. 5 is a flow chart of a manufacturing method of an electrostatic protection device provided by an embodiment of the present disclosure.
Figure 6A:
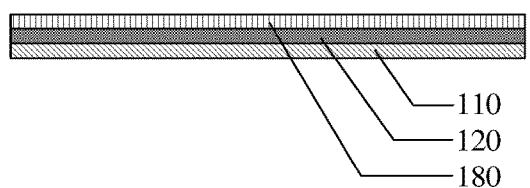
FIG. 6a-FIG. 6j are schematic views of an electrostatic protection device provided by an embodiment of the present disclosure.
Figure 6B:
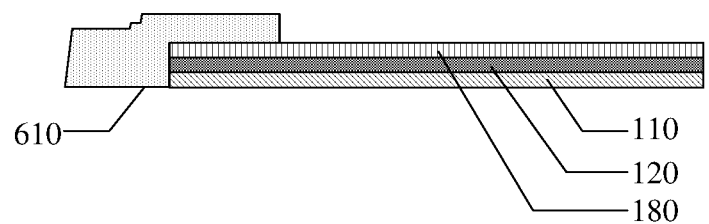
Figure 6C:
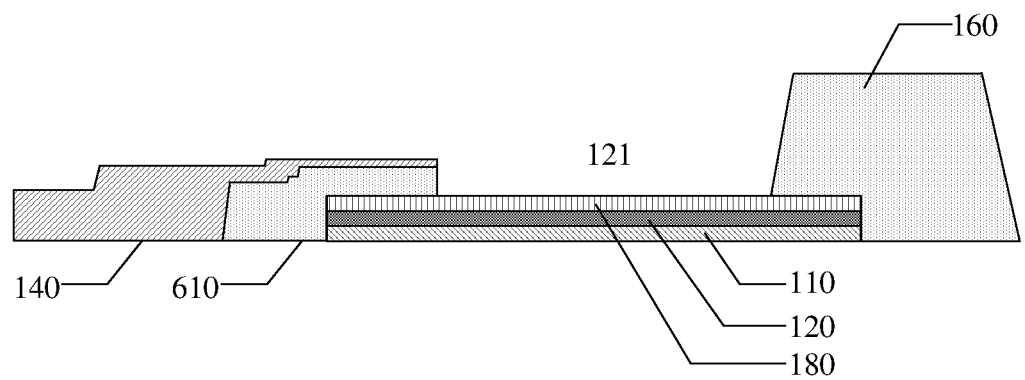
Figure 6D:
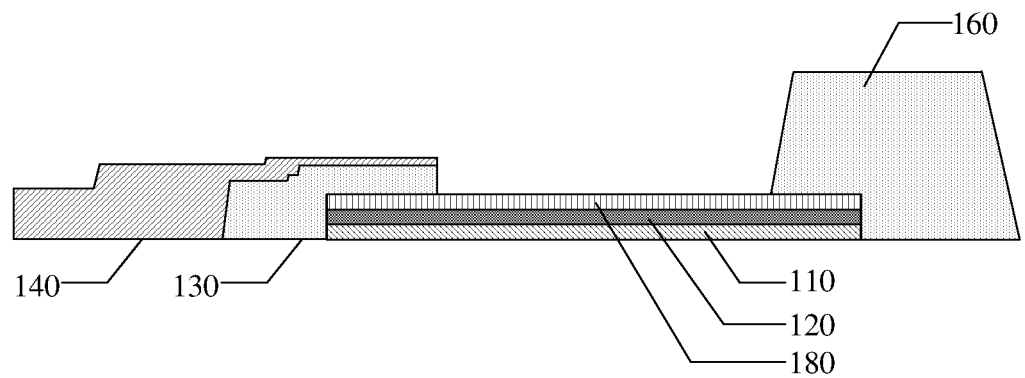
Figure 6E:
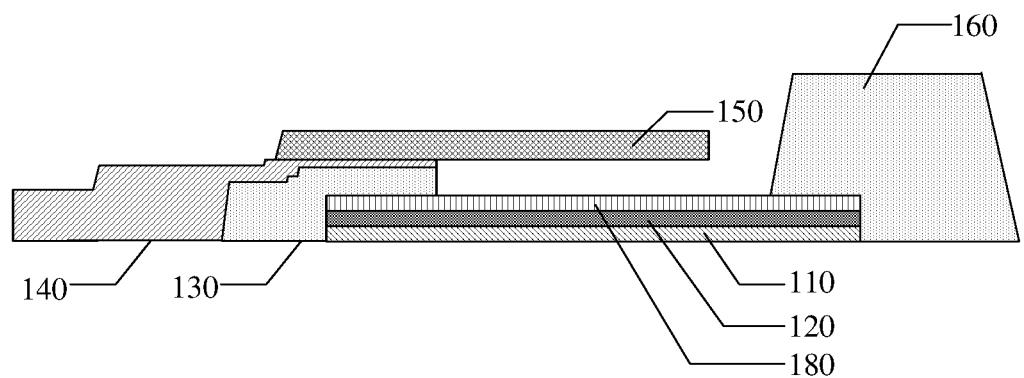
Figure 6F:
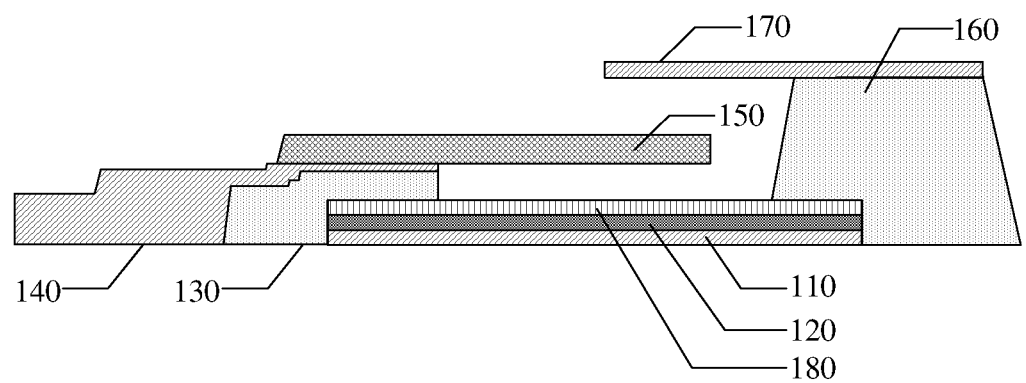

FIG. 5 illustrates a flow chart of a manufacturing method of an electrostatic protection device. As illustrated in the figure, the manufacturing method comprises the following operations:

S501: forming a first conductive layer 110, forming a first insulating layer 120 on the first conductive layer 110 and forming an orientation layer 180 on the first insulating layer, wherein the orientation layer 180 is configured to buffer a lattice mismatch between the first conductive layer and the polarization film layer, and the structure of the device in this situation can be referred to FIG. 6a;

S502: forming a piezoelectric film layer 610 which is at least partially on the orientation layer and obtained from a piezoelectric material capable of deforming when applied with electricity, wherein the structure of the device in this situation can be referred to FIG. 6b;

S503: forming a second conductive layer 140 which is at least on the polarization film layer, forming a second insulating layer 160 on the first insulating layer, wherein a gap 121 exists between the second insulating layer 160 and the second conductive layer 140 and the specific structure in this situation can be referred to FIG. 6c;

S504: performing a polarization treatment on the piezoelectric film layer 610 in a condition the voltage difference between the first conductive layer and the second conductive layer reaches a predetermined value to form a polarization film layer 130, wherein the structure of the device in this situation can be referred to FIG. 6d;

S505: forming a conductive cantilever 150 on the second conductive layer wherein the free end of the conductive cantilever corresponds to the first conductive layer and the structure of the device in this situation can be referred to FIG. 6e;

S506: forming a charge diffusion layer 170 on the second insulating layer 170 wherein the charge diffusion layer is connected with the first conductive layer through the via hole in the second insulating layer (not shown in FIG. 6f), the projections of the second end of the charge diffusion layer and the free end of the conductive cantilever on the first conductive layer are overlapped with each other and the structure of the device in this situation can be referred to FIG. 6f.

For example, an atom distance difference value between the orientation layer and the polarization film layer is less than or equal to 10 pm. For example, the orientation layer is an active layer.

For example, the step S502 comprises the following steps:

forming a piezoelectric material on the first insulating layer using metal oxide chemical vapor deposition (MOCVD) to form a weak-orientation thin film layer which is at least partially on the first insulating layer; performing an annealing treatment to the weak-orientation thin film layer under a first pre-determined temperature to form a piezoelectric film layer with a polycrystalline structure, wherein the first predetermined temperature is higher than or equal to 250° C. as well as lower than or equal to 350° C.

For example, forming the polarization film layer in the step S504 comprises the following operations:

adjusting the voltage between the first conductive layer and the second conductive layer upon the polycrystalline-structure piezoelectric film layer 610 reaching a second predetermined temperature wherein the second predetermined temperature is higher than or equal to 50° C. as well as lower than or equal to 150° C.; and cooling to a third predetermined temperature after the adjusted voltage reaches a predetermined voltage difference to form the polarization film layer wherein the third predetermined temperature is higher than or equal to 10° C. as well as lower than or equal to 40° C.

Figure 6G:
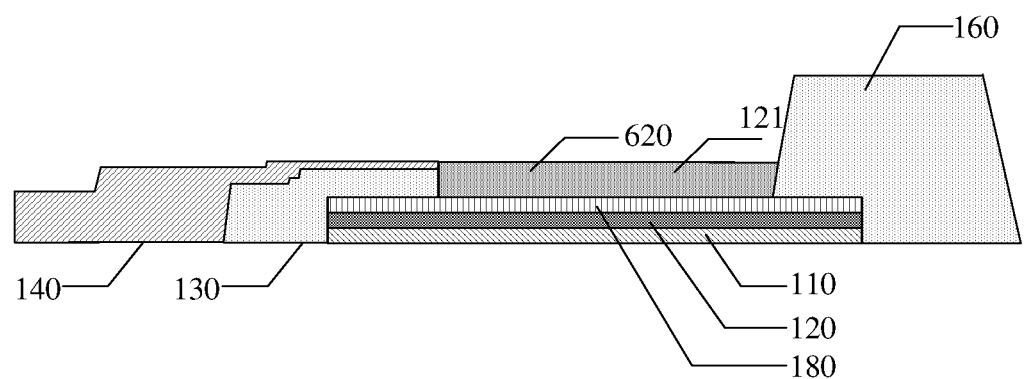
Figure 6H:
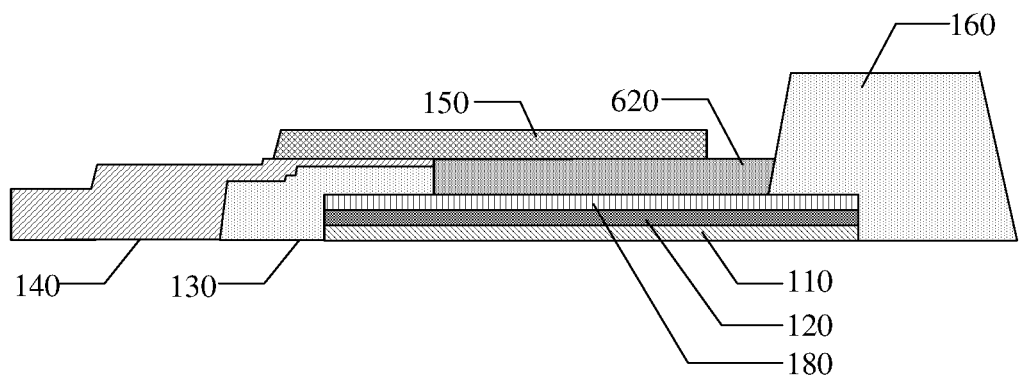
Figure 6I:
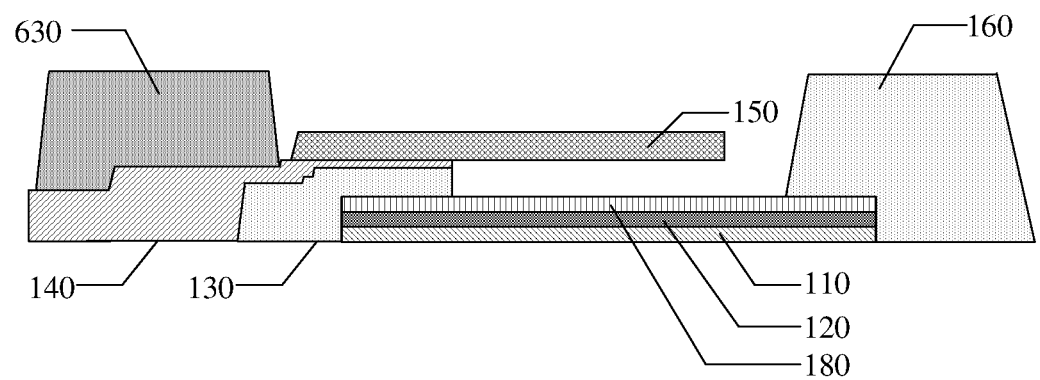
Figure 6J:
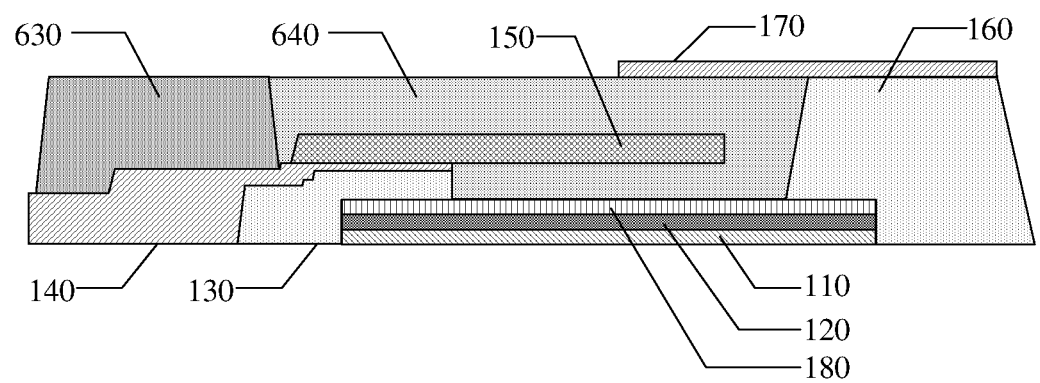

For example, forming the conductive cantilever in step S505 comprises the following operations:

forming a first photoresist 620 on the second conductive layer, that is, filling the gap 121 between the second conductive layer 140 and the second insulating layer wherein the first photoresist 620 is connected with the second conductive layer 140 and has a surface with a same height as the surface of the second insulating layer 160, as illustrated in FIG. 6g;

depositing a first nano indium tin oxide (ITO) layer on the second conductive layer and the first photoresist and forming the conductive cantilever through an annealing treatment, as illustrated in FIG. 6h;

removing the first photoresist 620 below the conductive cantilever through an exposing process to obtain the conductive cantilever corresponding to the first conductive layer;

For example, forming the charge diffusion layer in step S506 comprises the following operations:

forming a third insulating layer 630 on the second conductive layer as illustrated in FIG. 6i;

depositing a second photoresist 640 between the second insulating layer 160 and the third insulating layer, wherein the second photoresist 640 is connected with the second insulating layer 16 and has a surface with a same height as the surface of the second insulating layer 160;

depositing a second nano indium tin metal oxide (ITO) layer on the second insulating layer and the second photoresist, and forming a charge diffusion layer through an annealing treatment as illustrated in FIG. 6j; and removing the second photoresist 640 between the second insulating layer and the third insulating layer through an exposing process to obtain the charge diffusion layer, wherein the conductive cantilever is disposed between the first conductive layer and the charge diffusion layer and the projections of the free end of the charge diffusion layer and the free end of the conductive cantilever on the first conductive layer are overlapped with each other.

For example, the third insulating layer can be a film layer made of an organic material.

The embodiments of the present disclosure provide an electrostatic protection device and a manufacturing method thereof and an array substrate. The present disclosure provides a combination of a conductive cantilever with a free end and a polarization film layer which can gradually grow with an increase of an applied voltage instead of manner of triodes electrically connected in parallel or in series. In a condition that the voltage difference between the first conductive and the second conductive layer is a normal voltage difference, the conductive cantilever is at a suspended state, so that the first conductive layer and the second conductive layer are disconnected and the signal of the load of the first conductive layer or the second conductive layer is prevented form influence. In a condition that the voltage difference between the first conductive and the second conductive layer reaches above the normal voltage difference, the conductive cantilever is connected with the charge diffusion layer. Because the fixed end of the conductive cantilever is connected with the second conductive layer, and the fixed end of the charge diffusion layer is connected with the first conductive layer, the first conductive layer and the second conductive layer are connected so as to realize the effect of discharging static electricity.

What are described above is related to the illustrative embodiments of the disclosure only and not limitative to the scope of the disclosure; the scopes of the disclosure are defined by the accompanying claims.

The application claims priority to the Chinese patent application No. 201710330412.5, filed on May 11, 2017, the entire disclosure of which is incorporated herein by reference as part of the present application.

What is claimed is:

1. An electrostatic protection device, comprising:
a first conductive layer, a second conductive layer and a polarization film layer, wherein the polarization film layer is disposed between the first conductive layer and the second conductive layer and formed of a piezoelectric material which is capable of deforming when applied with electricity;
a conductive cantilever, disposed on the second conductive layer and comprising a free end; and
a charge diffusion layer, disposed at a side of the conductive cantilever away from the polarization film layer, electrically connected with the first conductive layer and spaced apart from the conductive cantilever,
wherein upon a voltage difference between the first conductive layer and the second conductive layer reaching a predetermined value, the polarization film layer deforms to allow the free end of the conductive cantilever to connect with the charge diffusion layer.

2. The electrostatic protection device according to claim 1, further comprising an orientation layer disposed between the first conductive layer and the polarization film layer, wherein the orientation layer is configured to decrease lattice mismatch between the first conductive layer and the polarization film layer.

3. The electrostatic protection device according to claim 1, wherein a deforming direction of the polarization film layer is along a voltage applying direction between the first conductive layer and the second conductive layer.

4. The electrostatic protection device according to claim 1, wherein a projection of the charge diffusion layer on the first conductive layer is at least partially overlapped with a projection of the free end of the conductive cantilever on the first conductive layer.

5. The electrostatic protection device according to claim 1, wherein the polarization film layer comprises a Cr-doped zinc oxide layer.

6. A manufacturing method of an electrostatic protection device, comprising:
sequentially forming a first conductive layer, a polarization film layer, and a second conductive layer, the polarization film layer comprising a piezoelectric material which is capable of deforming when applied with electricity;
forming a conductive cantilever on the second conductive layer, the conductive cantilever comprising a free end;
forming a charge diffusion layer which is electrically connected with the first conductive layer, disposed at a side of the conductive cantilever away from the polarization film layer and spaced apart from the conductive cantilever,
wherein upon a first voltage difference between the first conductive layer and the second conductive layer reaching a predetermined value, the polarization film layer deforms to allow the free end of the conductive cantilever to connect with the charge diffusion layer.

7. The manufacturing method according to claim 6, wherein forming the polarization film layer comprises:
forming a piezoelectric film layer on the first conductive layer; and
performing a polarization treatment on the piezoelectric film layer in a condition that the a second voltage difference between the first conductive layer and the second conductive layer reaches the predetermined value.

8. The manufacturing method according to claim 7, wherein forming the piezoelectric film layer comprises:
depositing a piezoelectric material to form a weak-orientation film layer; and
annealing the weak-orientation film layer at a first predetermined temperature to form a first piezoelectric film layer with a polycrystalline structure, wherein the first predetermined temperature is higher than or equal to 250° C. as well as lower than or equal to 350° C.

9. The manufacturing method according to claim 8, wherein performing the polarization treatment on the piezoelectric film layer comprises:
allowing the first piezoelectric film layer to a second predetermined temperature, and adjusting the second voltage difference between the first conductive layer and the second conductive layer, wherein the second predetermined temperature is higher than or equal to 50° C. as well as lower than or equal to 150° C.; and
after the second voltage difference between the first conductive layer and the second conductive layer as adjusted reaching the predetermined value, cooling the first piezoelectric film layer to a third predetermined temperature so as to form the polarization film layer, wherein the third predetermined temperature is higher than or equal to 10° C. as well as lower than or equal to 40° C.

10. The manufacturing method according to claim 6, wherein forming the conductive cantilever comprises:
    forming an insulating layer after forming the second conductive layer, wherein a gap is between the insulating layer and the second conductive layer;
    forming in the gap a first photoresist which is connected with the second conductive layer and has a surface with a same height as a surface of the second conductive layer; and
    forming a first nano indium tin metal oxide layer on the second conductive layer and the first photoresist and forming the conductive cantilever through a first annealing treatment.

11. The manufacturing method according to claim 10, wherein a surface of the insulating layer is higher than a surface of the conductive cantilever, and forming the charge diffusion layer comprises:
    forming in the gap a second photoresist which is connected with the insulating layer and has a surface with a same height as a surface of the insulating layer;
    forming a second nano indium tin metal oxide layer on the insulating layer and the second photoresist and forming the charge diffusion layer through a second annealing treatment.

12. The manufacturing method according to claim 6, further comprising:
    before forming the polarization film layer, forming an orientation layer on the first conductive layer, wherein the orientation layer is configured to decrease a lattice mismatch between the first conductive layer and the polarization film layer.

13. The manufacturing method according to claim 12, wherein a material of the orientation layer comprises polysilicon.

14. The electrostatic protection device according to claim 2, wherein a material of the orientation layer comprises polysilicon.

15. An array substrate, comprising the electrostatic protection device according to claim 1.

16. The array substrate according to claim 15, comprising a display region and a peripheral region, wherein the electrostatic protection device is disposed in the peripheral region.

17. The array substrate according to claim 15, comprising a gate line and a common electrode line,
    wherein the first conductive layer of the electrostatic protection device is connected with the gate line and the second conductive layer of the electrostatic protection device is connected with the common electrode line.

18. The array substrate according to claim 17, wherein the first conductive layer is disposed in a same layer as the gate line and the second conductive layer is disposed in a same layer as the common electrode line.

19. The array substrate according to claim 15, comprising a data line and a common electrode line,
    wherein the first conductive layer of the electrostatic protection device is connected with the data line and the second conductive layer of the electrostatic protection device is connected with the common electrode line.

20. The array substrate according to claim 19, wherein the first conductive layer is disposed in a same layer as the data line and the second conductive layer is disposed in a same layer as the common electrode line.

* * * * *